United States Patent
Zhang (10) Patent No.: US 10,608,132 B2
(45) Date of Patent: Mar. 31, 2020

(54) BACK-CONTACT CELL MODULE AND METHOD OF MANUFACTURING SAME

(71) Applicant: SUZHOU COOP&INNO GREEN ENERGY TECHNOLOGY Co., Ltd, Suzhou (CN)

(72) Inventor: Guoming Zhang, Wuxi (CN)

(73) Assignee: SUZHOU COOP&INNO GREEN ENERGY TECHNOLOGY CO., LTD, Suzhou (CN)

( * ) Notice: Subject to any disclaimer, the term of this patent is extended or adjusted under 35 U.S.C. 154(b) by 61 days.

(21) Appl. No.: 15/742,887

(22) PCT Filed: Jun. 2, 2016

(86) PCT No.: PCT/CN2016/084499
§ 371 (c)(1),
(2) Date: Jan. 9, 2018

(87) PCT Pub. No.: WO2017/161692
PCT Pub. Date: Sep. 28, 2017

(65) Prior Publication Data
US 2018/0204968 A1    Jul. 19, 2018

(30) Foreign Application Priority Data
Mar. 21, 2016   (CN) .......................... 2016 1 0162851

(51) Int. Cl.
*H01L 31/05*     (2014.01)
*H01L 31/0224*   (2006.01)
*H01L 31/18*     (2006.01)

(52) U.S. Cl.
CPC .... *H01L 31/0516* (2013.01); *H01L 31/02245* (2013.01); *H01L 31/18* (2013.01); *H01L 31/1876* (2013.01); *Y02E 10/50* (2013.01)

(58) Field of Classification Search
None
See application file for complete search history.

(56) References Cited

U.S. PATENT DOCUMENTS 6,156,967 A    12/2000   Ralph et al.

FOREIGN PATENT DOCUMENTS

| CN | 101375411 A | 2/2009 |
| CN | 103730521 A | 4/2014 |
| CN | 103928555 A | 7/2014 |

OTHER PUBLICATIONS

Machine Translation CN Ref Zhifeng Accessed Sep. 2019 (Year: 2019).*

* cited by examiner

*Primary Examiner* — Shannon M Gardner
(74) *Attorney, Agent, or Firm* — Bayramoglu Law Offices LLC (57) ABSTRACT

A back-contact cell module including cells and connecting ribbons; a main gate electrode for gathering currents of the auxiliary gate electrode and a linear back side electrode for leading out the currents provided on the back side of the cell; the main gate electrodes, located on the back side of the cell and in one-to-one correspondence with positions of current collection holes, are arranged linearly, parallel to the back side electrode and located at two ends of the back side of the cell; the plurality of cells are arranged parallelly in columns, between two adjacent cells, the main gate electrode of one cell is arranged adjacent to the back side electrode of the other cell; the main gate electrode of one cell is fixedly connected to the back side electrode of the other adjacent cell via the connecting ribbon.

10 Claims, 13 Drawing Sheets

BACK-CONTACT CELL MODULE AND METHOD OF MANUFACTURING SAME

CROSS REFERENCE TO RELATED APPLICATIONS

This application is the national phase entry of International Application No. PCT/CN2016/084499, filed on Jun. 2, 2016, which claims priority from the Chinese patent application no. 201610162851.5 filed on Mar. 21, 2016, the entire contents of which are incorporated herein by reference.

TECHNICAL FIELD

The present invention relates to back-contact solar cell module technology, and more particularly to a back-contact cell module and a method of manufacturing the same.

BACKGROUND

With a rise in energy prices, development and utilization of new energy resources have become main subjects in the current energy field research. Since solar energy is pollute-free, inexhaustible and without regional limitations, research on solar power generation becomes a main direction for developing and utilizing new energy resources. Nowadays, utilization of solar power generation is a major way of using solar energy, there is a structure of electrode main gate lines on the front side of a conventional solar cell, and the electrode main gate lines on the front side will block a part of sunlight and reduce the overall conversion efficiency of the cell; Adoption of a cell with no blocking design on the front side can achieve much higher conversion efficiency and power output, and the corresponding module product will achieve higher output and power generation capacity, and reduce the cost at the application end. Such is a trend and a direction of the development.

The current module without obstruction on the front side is applied with the MWT back-contact type cell module products, however, the overall design and process paths of the corresponding MWT cell module on the actual market need to be improved, the current back-contact process actually encounters challenges from the cell design and module design processes, so as to achieve high output efficiency of the cell. Since the overall manufacturing costs of the cell and the cell module are high, applications of products adopting this technology have not been accepted in the market place, but still remain at very small experiments and low production capacity applications. The main reason for this is that, a choice between a design direction of the cell and a design process of corresponding module needs to be made at the cell end, and there are two key points, one is that expensive conductive back sheet is often required to design the module, and the other is that it is difficult for the welding process of the module to achieve an automated process.

Technical Problems

Figure 1:
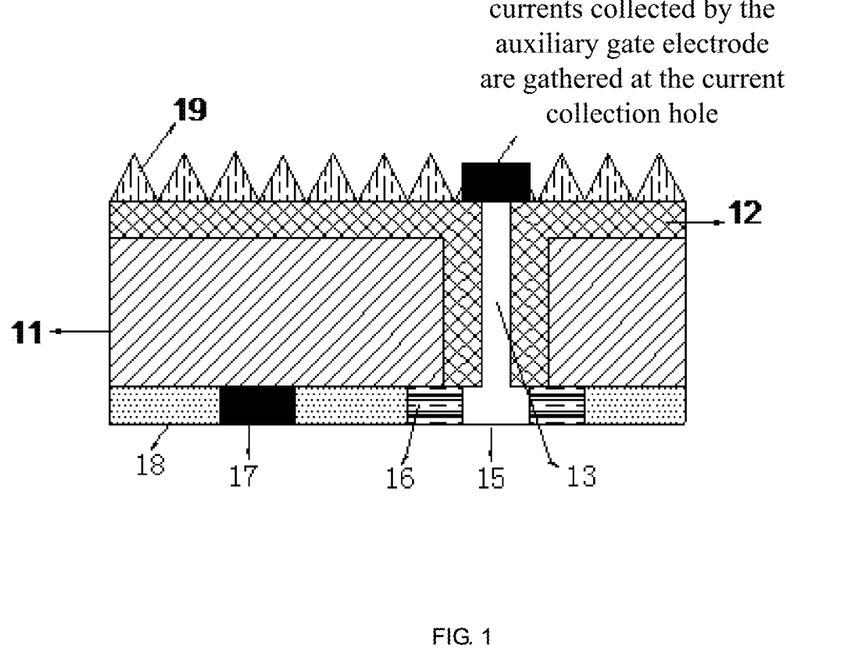
FIG. 1 is a schematic structural diagram of a back contact MWT cell in the prior art.

FIG. 1 is a schematic structural diagram of a back contact MWT cell in the prior art. As shown in FIG. 1, the cell is divided into a first conductive type region 11 and a second conductive type region 12, and a PN junction is formed between the first conductive type region 11 and the second conductive type region 12. The first conductive type region 11 can be a silicon-based P-type lightly doped region, and the second conductive type region 12 is an N-type heavily doped region accordingly. Alternatively, the first conductive type region 11 can be a silicon-based N-type heavily doped region, and the second conductive type region 12 is a P-type lightly doped region accordingly. An auxiliary gate electrode (parallel to paper sheet) for collecting currents is provided on the front side of the cell. An anti-reflective film 19 is also provided on the front side of the cell, and the anti-reflective film 19 can be made of various materials, such as a SiNx type anti-reflective film. A main gate electrode 15 for gathering currents of the auxiliary gate electrode and a back side electrode 17 for leading out the currents are provided on the back side of the cell. An insulating region 16 is provided between the main gate electrode 15 and the back side electrode 17. A plurality of current collection holes 13 are provided on a substrate of the cell, the auxiliary gate electrode is connected to the main gate electrode 15 via the current collection hole 13, and the current collected by the auxiliary gate electrode is transmitted to the main gate electrode 15 via the current collection hole 13. An aluminum back-surface field 18 is also provided on the back side of the cell.

It can be seen that, after the back contact cell is designed, the current needs to be led out by the main gate electrode and the back side electrode on the back. After the cell is assembled into a cell module, the current of multiple sets of main gate electrodes and the back side electrode needs to be efficiently led out.

In order to assemble cells into a cell module, there are two types of mainstream design trends for the back-contact cell currently in the market, one mode is to design a welding process suitable for module ribbons between cells, and the other mode is a process to form a circuit with a conductive circuit design of a back sheet.

Figure 2:
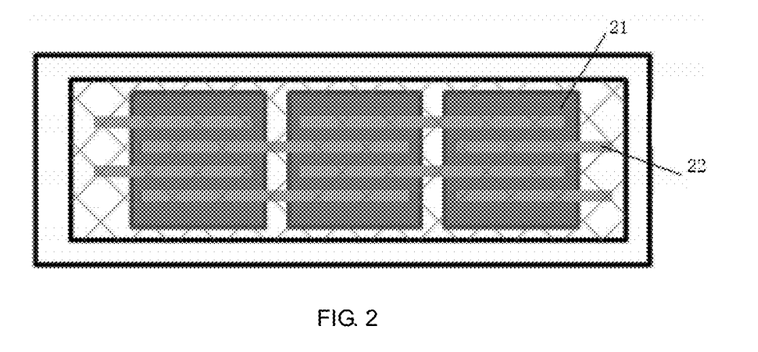
FIG. 2 is a schematic diagram of a welding process in the prior art according to an embodiment.

FIG. 2 is a schematic diagram of a welding process in the prior art according to an embodiment. As can be seen from FIG. 2, each of cells 21 can lead out a plurality of cell positive electrodes and cell negative electrodes, if a welding process of module ribbons is adopted to connect therewith, it is necessary to connect the plurality of cell positive electrodes and cell negative electrodes which are located at different positions at intervals, since the welding position of the ribbon 22 is changed from time to time, automated welding cannot be performed continuously, and therefore, the welding process has a low degree of automation, and the production efficiency cannot be improved.

Figure 3:
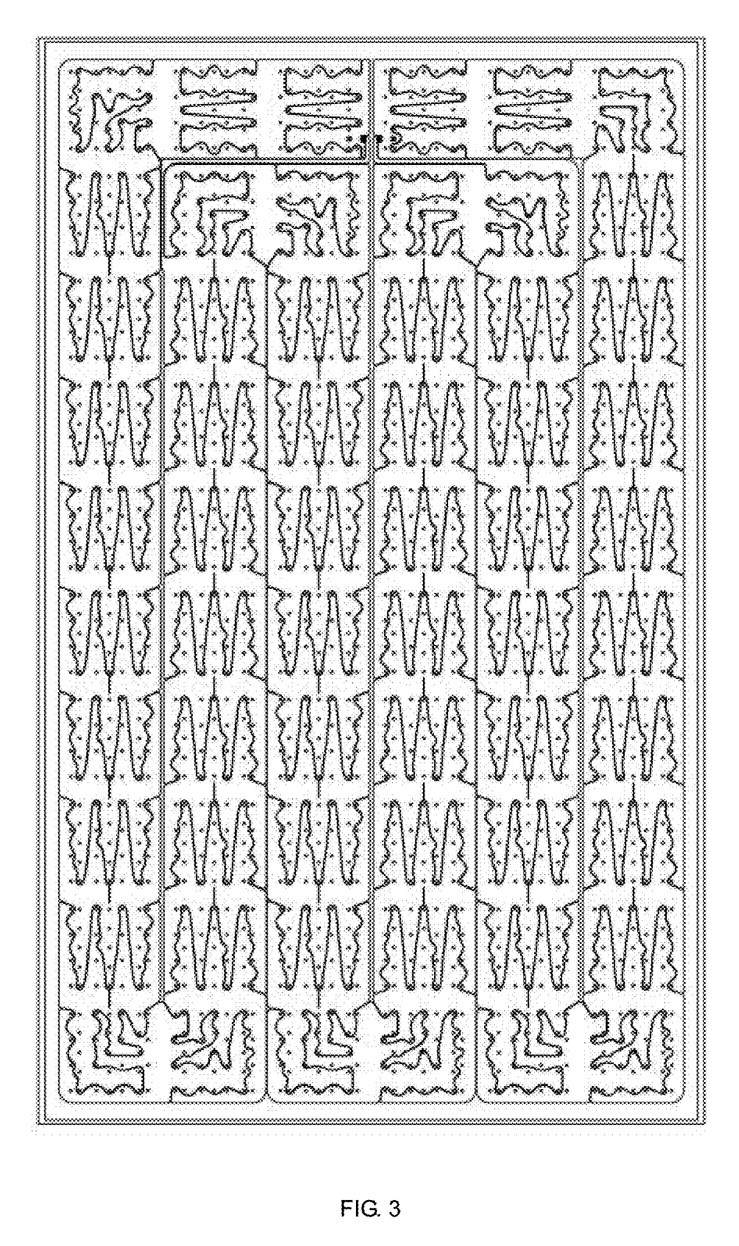
FIG. 3 is a schematic diagram of a conductive circuit of a back sheet in the prior art according to an embodiment.

FIG. 3 is a schematic diagram of a conductive circuit of a back sheet in the prior art according to an embodiment. As can be seen from FIG. 3, the wirings of the conductive circuits on the back sheet are very complicated, and thus the printing process is also very complicated.

FIG. 2 and FIG. 3 shows two core problems of back-contact solar cell in the prior art, and the two problems make the integrated manufacturing costs of the back-contact solar cell expensive, although the efficiency is high, the product cannot generally accepted in the market, and product development lags behind its due rate of development.

In addition, a conventional back-contact solar cell has a further disadvantage, namely, the long-term heating of the perforated current is plagued by large currents, which leads to a long-term potential performance risk for the cells, besides, requirements for the perforation process and packing of the current collection hole are stringent, as a result, the manufacturing process is complex, and the cost is high.

SUMMARY

In view of disadvantages in the prior art, the present invention discloses a back-contact cell module and a method of manufacturing the same.

Technical solutions of the present invention are as follows:

A back-contact cell module, comprising a plurality of cells and a plurality of connecting ribbons;

an auxiliary gate electrode for collecting currents is provided on the front side of the cell; a plurality of current collection holes are provided on a substrate of the cell; a main gate electrode for gathering currents of the auxiliary gate electrode and a back side electrode for leading out the currents are provided on the back side of the cell; the auxiliary gate electrode is connected to the main gate electrode via the current collection hole; wherein, the back side electrode is linear, and there are only one set of back side electrodes; the main gate electrodes, located on the back side of the cell and in one-to-one correspondence with positions of current collection holes, are arranged linearly, parallel to the back side electrode and located at two ends of the back side of the cell, respectively;

the plurality of cells are arranged in parallel in columns, between two adjacent cells, the main gate electrode of one cell is arranged adjacent to the back side electrode of the other cell; the main gate electrode of one cell is fixedly connected to the back side electrode of the other adjacent cell via the connecting ribbon.

Furthermore, the current collection holes are arranged in one row or more rows; when the current collection holes are arranged in more rows, two adjacent current collection holes are located at two different rows.

Furthermore, multiple sets of auxiliary gate electrodes are arranged in parallel in a longitudinal direction, and in one-to-one correspondence with the plurality of current collection holes; multiple sets of anti-break electrodes are arranged perpendicularly and crosswise to the auxiliary gate electrodes.

Furthermore, the connecting ribbon is made of elastic materials, and comprises a first slot in a lengthwise direction and a second slot in a transverse direction; the first slot is located at the middle portion of the connecting ribbon and pass through the connecting ribbon; the second slot is located at two side edges of the connecting ribbon, making a longitudinal edge of the connecting ribbon to form a shape of notches; a plurality of the second slots are arranged at equal intervals; a plurality of the first slots are arranged in parallel with one another.

Furthermore, a continuous linear insulating region is printed around the main gate electrode, and the connecting ribbon is made of conductive materials.

Furthermore, an insulating region is printed around each main gate electrode; insulating regions around two adjacent main gate electrodes are discontinuous from each other; a layer of insulating materials are overlaid on the main gate electrode; a hole is provided on the insulating material at a positions corresponding to the position of the main gate electrode; the connecting ribbon is made of conductive materials.

Furthermore, an insulating region is printed around each main gate electrode; insulating regions around two adjacent main gate electrodes are discontinuous from each other; the connecting ribbon is made of conductive materials; an insulating region is provided on the connecting ribbon and at a side for connecting the main gate electrode, holes are provided on the insulating region at positions in one-to-one correspondence with the positions of the main gate electrodes; when the connecting ribbon and the cell are stacked and welded, the main gate electrode passes through the insulating region of the connecting ribbon and is in contact with the conductive materials.

Furthermore, a plurality of cell columns are arranged to be a cell module, between two adjacent sets of cell columns, positions of the cells are all in one-to-one correspondence with positions of the connecting ribbons; in each column, the main gate electrode of one cell is fixedly connected to the back side electrode of the other adjacent cell via the connecting ribbon, and between adjacent columns, connecting ribbons with corresponding positions are all interconnected.

A method of manufacturing the back-contact cell module described above, comprising the following steps of:

step 1, printing and manufacturing a cell on a monocrystalline silicon wafer with a conventional back contact process, wherein, after the cell has been manufactured, the back side of an original sheet printed with the cell comprises multiple pairs of back side electrodes and main gate electrodes which are parallel to each other;

step 2, taking a region where one pair of back side electrodes and main gate electrodes are located as a cell region; providing a cutting line parallel to the back side electrode between two adjacent cell regions;

step 3, cutting along the cutting line to obtain a single piece of cell.

step 4, arranging the plurality of cells in parallel in the same direction, wherein, between two adjacent cells, the main gate electrode of one cell is adjacent to the back side electrode of the other cell; and step 5, welding the main gate electrode of one cell and the back side electrode of the other adjacent cell together via the connecting ribbon.

A method of manufacturing the back-contact cell module described above, comprising the following steps of:

step 1, printing and manufacturing a cell on a monocrystalline silicon wafer with a conventional back contact process, wherein, after the cell has been manufactured, the back side of an original sheet printed with the cell comprises multiple pairs of back side electrodes and main gate electrodes which are parallel to each other;

step 2, taking a region where one pair of back side electrodes and main gate electrodes are located as a cell region; providing a cutting line parallel to the back side electrode between two adjacent cell regions;

step 3, cutting along the cutting line to obtain a single piece of cell.

step 4, arranging the plurality of cells in parallel in the same direction in columns, wherein, in each column, the main gate electrode of one cell is adjacent to the back side electrode of the other cell; arranging a plurality of cell columns to be a cell module, wherein, between two adjacent sets of cell columns, positions of the cells are all in one-to-one correspondence with positions of the connecting ribbons;

step 5, welding the main gate electrode of one cell in each cell column and the back side electrode of the other adjacent cell together via the connecting ribbon, and meanwhile, welding the plurality of cell columns in the cell module together via the connecting ribbon.

Beneficial Effects of the Present Invention

Beneficial Effects

The beneficial technical effects of the prevent invention lie in that:

1. According to the cell module of the present invention, in the aspect of the structure, there is no electrode main gate line on the front side of the cell module, and therefore, there is no block on the sunlight, the conversion efficiency of the cell can be improved, and power loss of the cell can be reduced.

2. After the cell of the present invention is cut, the current flowing through the current collection hole will be greatly reduced, which increases the service life of the current collection hole, also correspondingly reduces the production requirements on the current collection hole, and thereby correspondingly reduces the material cost. In the prior art, currents are all directly led out after the cell is printed on the same piece of silicon wafer, assuming that the operating current is I, there are n current collection holes, and the current in each current collection hole is I/n, if the cell is cut into m pieces with the technique described in the present invention, the operating current will become 1/m, and then the current in each current collection hole is 1/mn. Obviously, the operating current is reduced, which can fundamentally solve the risk of current overheating in the current collection hole.

3. In the present invention, 3 to 10 cells can be manufactured simultaneously on the same piece of silicon wafer as required, and then sliced and cut to manufacture a single piece of newly-designed cell with a back-contact MWT process structure, a cell panel forms completely independent circuits after being equally divided, and the circuits can be connected according to different module requirements to manufacture a multi-mode module; The invention realizes a small cell of the module as a unit through a symmetric physical division of equal parts, electrodes of the small-unit cell are designed symmetrically, in the process of manufacturing the cell module, circuit welding with ribbons is adopted to achieve connection, therefore, a very good circuit interconnection and a very low heat loss can be achieved. Cells in series and circuit interconnection can be formed finally. As such, an automated circuit connection can be achieved through a welding mode completely orthogonal to a conventional ribbon, there is also no need to use expensive materials, such as a conductive back sheet and a conductive adhesive, and a highly automated process design with a low cost can be achieved. Therefore, the high cost problem in the manufacturing process described above is solved, and the present invention can achieve a high module power output with a low manufacturing cost.

4. 3 to 15 current collection holes can be made on the cell of the present invention as required, and the specific number can be selected according to different requirements on the operating current;

5. The main gate electrode forms a straight channel or a straight line at a current collection hole on the back of the cell, a secondary printing of an insulated isolation layer can make the entire perforated region of the electrode form a channel by connecting isolation layers which are insulated from each other, and therefore, it facilitates to assemble cells into a cell module and is particularly suitable for an automated production process of the module.

6. The present invention is suitable for an MWT back contact cell, an IBC cell process, a PERC cell process or a black silicon cell process, is very easy to maximize the cell efficiency, improves the cell efficiency by 21% and brings mass production into the application of modules, and as a result, the cell efficiency in the industry can be upgraded rapidly, and the final comprehensive cost can be reduced.

7. The invention also discloses a preferred technical solution, i.e., a cell module with an XY interconnection structure. Cells in the cell module are connected via connecting ribbons both transversely and longitudinally, since a plurality of cell columns are also connected via connecting ribbons, when connecting ribbons in a single cell column are damaged, the current transmission path will not be broken, the current can be transmitted in the connecting ribbons of an adjacent column, and therefore, the service life of the cell module can be increased.

BRIEF DESCRIPTION OF THE DRAWINGS

FIG. 10-a is a schematic diagram of the insulating material in FIG. 10.

FIG. 11-a is a back schematic diagram of the connecting ribbon in FIG. 11.

DETAILED DESCRIPTION OF THE INVENTION

The module according to the present invention includes a plurality of cells and a connecting ribbon for connecting the cells together.

Figure 4:
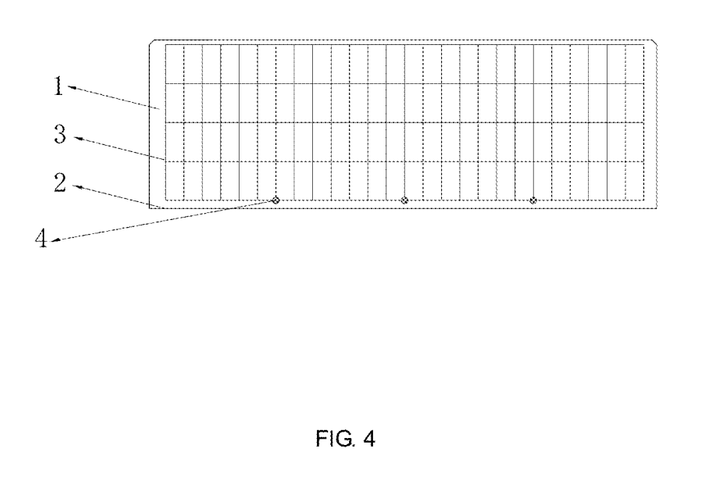
FIG. 4 is a front schematic diagram of a cell according to the present invention.

FIG. 4 is a front schematic diagram of a cell according to the present invention.

Figure 5:
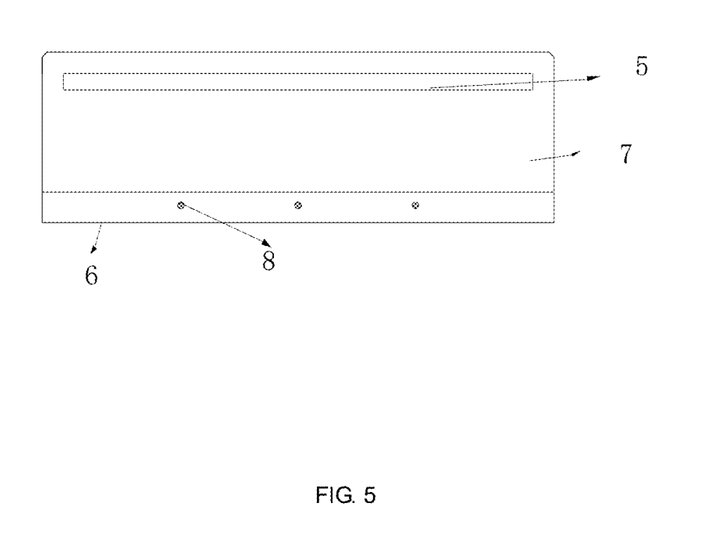
FIG. 5 is a back schematic diagram of a cell according to the present invention.

FIG. 5 is a back schematic diagram of a cell according to the present invention. An auxiliary gate electrode 3 for collecting currents is provided on the front side of the cell;

a main gate electrode 8 for gathering currents of the auxiliary gate electrode and a back side electrode 5 for leading out the currents are provided on the back side of the cell. A plurality of current collection holes 4 are provided on a substrate of the cell, and the current collection hole 4 can be seen from the front side of the cell. The auxiliary gate electrode 3 is connected to the main gate electrode 8 via the current collection hole 4. The auxiliary gate electrodes 3, the current collection holes 4 and the main gate electrodes 8 are all in one-to-one correspondence. Multiple sets of auxiliary gate electrodes are arranged in parallel in a longitudinal direction. The back side electrode 5 is linear, there are only one set of back side electrodes 5, the current collection holes 4 are arranged linearly, parallel to the back side electrode 5, then the main gate electrodes 8 are also arranged linearly, parallel to the back side electrode on the bake side of the cell, and located at two ends of the back side of the cell, respectively. An anti-reflective film 1 is also provided on the front side of the cell, for improving the working efficiency of the cell. An isolation layer region 6 is also provided around the main gate electrode 8 on the back side of the cell, for preventing the main gate electrode and the back side electrode of the cell which is easy to fracture after welding being short-circuited with each other. A back side aluminum field layer 7 is also provided on the back side of the cell.

Figure 6:
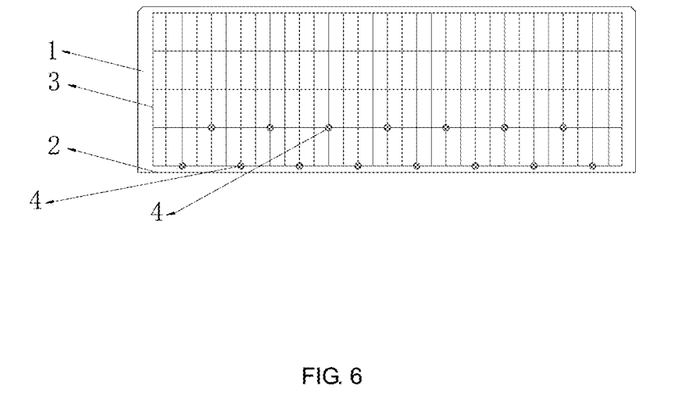
FIG. 6 is a front schematic diagram of a cell with multiple rows of current collection holes according to the present invention.

The current collection holes 4 can be arranged in one row or more rows. The cell shown in FIG. 4 only has one row of current collection holes. When the current collection holes are arranged in more rows, two adjacent current collection holes are located at two different rows. FIG. 6 is a front schematic diagram of a cell with multiple rows of current collection holes according to the present invention. The cell in FIG. 6 has two rows of current collection holes.

The number of current collection holes can be 3 to 15. The distances between adjacent current collection holes are equal. The cell in FIG. 4 is provided with 3 current collection holes, and the cell in FIG. 6 is provided with 15 current collection holes in each row.

Multiple sets of anti-break electrodes are provided on the front side of the cell and arranged perpendicularly and crosswise to the auxiliary gate electrodes. In case that the auxiliary gate electrode is open-circuited, the current can flow through the anti-break electrode and still gathers in the current collection hole.

Figure 7:
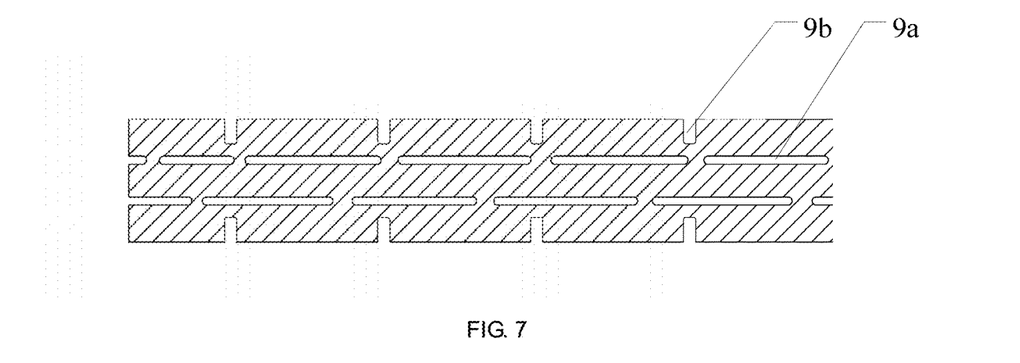
FIG. 7 is a schematic diagram of a slot of a connecting ribbon according to an embodiment.
Figure 8:
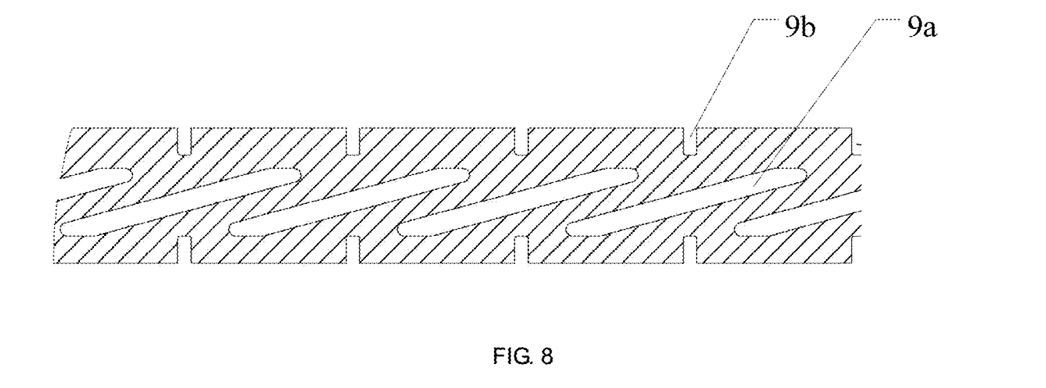
FIG. 8 is a schematic diagram of a slot of a connecting ribbon according to another embodiment.

The connecting ribbon includes a first slot 9a in a lengthwise direction and a second slot 9b in a transverse direction. The first slot 9a is located at the middle portion of the connecting ribbon and pass through the connecting ribbon. The second slot 9b is located at two side edges of the connecting ribbon, making a longitudinal edge of the connecting ribbon to form a shape of notches. The second slots 9b are arranged at equal intervals. The first slots 9a are arranged in parallel with one another. The first slot 9a can be parallel to a longitudinal edge of the connecting ribbon, or form an included angle of less than 30° with the longitudinal edge of the connecting ribbon. FIG. 7 is a schematic diagram of a slot of a connecting ribbon according to an embodiment. In FIG. 7, the first slot 9a is parallel to the longitudinal edge of the connecting ribbon. FIG. 8 is a schematic diagram of a slot of a connecting ribbon according to another embodiment. In FIG. 7, the first slot 9a forms an included angle with the longitudinal edge of the connecting ribbon.

The role of the first slot 9a in a lengthwise direction is that, when two adjacent cells are connected together via the connecting ribbon, since the connecting ribbon is made of elastic materials, the two pieces of cells will generate a relative displacement under the condition that the thermal expansion coefficients of the combined materials are different, and the first slot 9a can absorb the relative displacement to avoid a large internal stress, so that the cells in the module cannot be deformed due to an external or external stress, and can maintain a longer service life. The role of the second slot 9b in a transverse direction is that, after the two edges of the connecting ribbon are fixed by welding with adjacent cells, respectively, since the thermal expansion coefficients of the connecting ribbon and cells are different, when the temperature changes, the connecting ribbon and cells may have different volumetric changes due to the thermal expansion and contraction effect, and the second slot 9b can reduce the stress generated due to the volumetric change, maintain a firm connection and have no damage on the cells.

With reference to different printing processes of the cell, the connecting ribbon also can have various forms.

Figure 9:
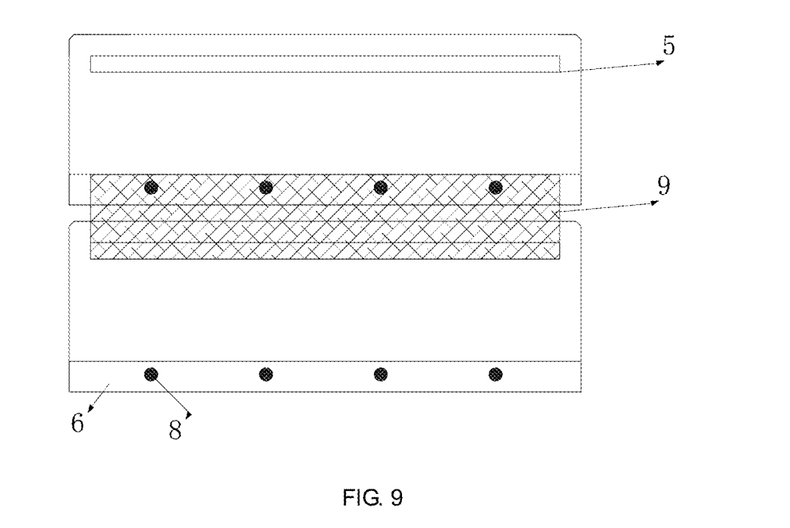
FIG. 9 is a schematic diagram of a connecting ribbon according to Embodiment 1.

FIG. 9 is a schematic diagram of a connecting ribbon according to Embodiment 1. A continuous, linear insulating region 6 is printed around the main gate electrode 8, and the connecting ribbon 9 is made of conductive materials. The main gate electrode 8 conducts with the back side electrode of the adjacent cell by welding of the connecting ribbon 9, but is insulated from the back side electrode of the cell itself.

Figure 10:
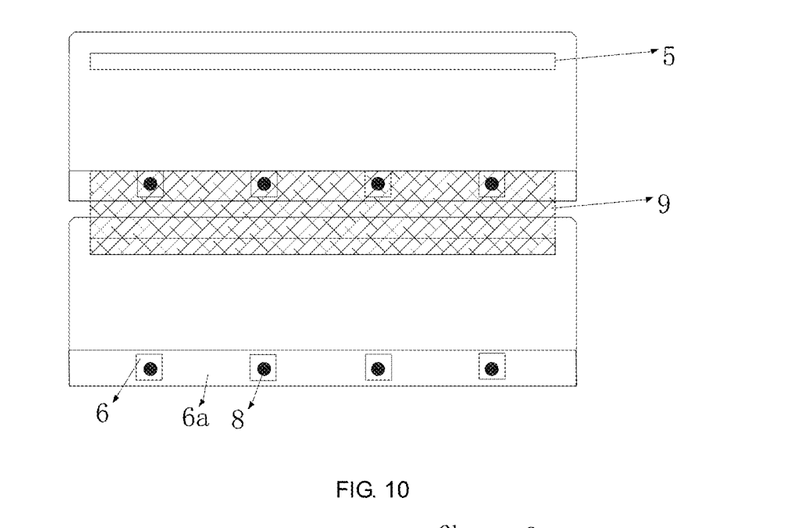
FIG. 10 is a schematic diagram of a connecting ribbon according to Embodiment 2.
Figure 10A:
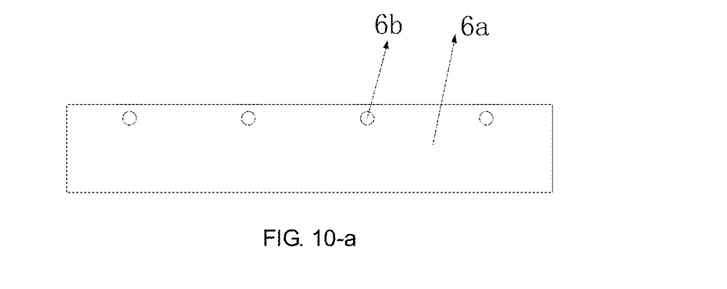

FIG. 10 is a schematic diagram of a connecting ribbon according to Embodiment 2. In FIG. 10, an insulating region 6 is printed around each main gate electrode 8, and the insulating region has a small area, insulating regions around two adjacent main gate electrodes are discontinuous from each other. A layer of insulating materials are overlaid on the main gate electrode, and FIG. 10-a is a schematic diagram of the insulating material in FIG. 10. A hole 6b is provided on the insulating material 6a at a positions corresponding to the position of the main gate electrode; the connecting ribbon 9 is made of conductive materials. In this embodiment, when the connecting ribbon welds two adjacent cells together, the main gate electrode 8 passes through the hole 6b on the insulating material 6a, and conducts with the back side electrode of the adjacent cell via the connecting ribbon 9 at the joint with the connecting ribbon 9 made of conductive materials, but the main gate electrode is insulated from the back side electrode of the cell itself, due to the presence of the insulating material 6a.

Figure 11:
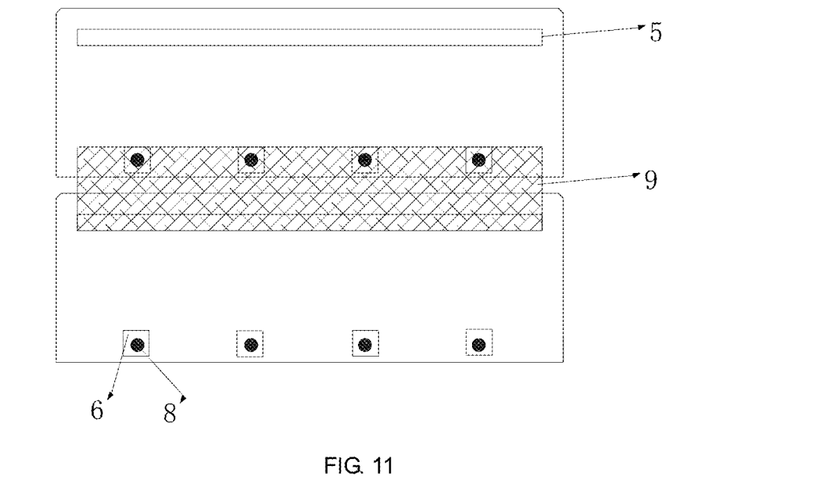
FIG. 11 is a schematic diagram of a connecting ribbon according to Embodiment 3.
Figure 11A:
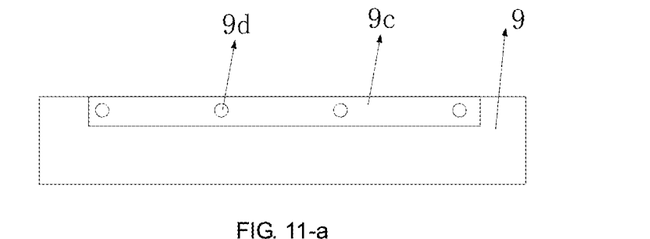

FIG. 11 is a schematic diagram of a connecting ribbon according to Embodiment 3. In FIG. 11, an insulating region 6 is printed around each main gate electrode 8, the insulating region has a small area, and thus insulating regions around two adjacent main gate electrodes are discontinuous from each other. FIG. 11-a is a back schematic diagram of the connecting ribbon in FIG. 11. The connecting ribbon is made of conductive materials, a ribbon insulating region 9c is provided on the connecting ribbon and at a side for connecting the main gate electrode, holes 9d are provided on the ribbon insulating region 9c at positions in one-to-one correspondence with the positions of the main gate electrodes. When the connecting ribbon 9 is welded with the cell, the main gate electrode 8 passes through the hole 9d and is in contact with the conductive materials on the body of the connecting ribbon, and therefore, the main gate electrode 8 can conduct with the back side electrode of the adjacent cell via the connecting ribbon 9, but the main gate electrode is insulated from the back side electrode of the cell itself, due to the presence of the ribbon insulating region 9c.

Three embodiments of the connecting ribbon are described above, and can be selected based on the actual situation. Non-conductive adhesive stickers can act as the insulating materials in the three embodiments. Embodiment 1 shows a conventional method, that is, a non-conductive insulating film is formed in the printing process of the cell, and then welding is done via a connecting ribbon. The welding place of the main gate electrode in Embodiment 2 actually has three layers of materials, that is, the cell, the insulating material stacked on the main grid electrode of the cell and the connecting ribbon, due to the presence of the insulating material 6a, it is unnecessary to print a wide range of insulating region during manufacturing of the cell, and materials can be saved. In Embodiment 3, there is only a small range of insulating region around the main gate electrode of the cell, but the connecting ribbon in this embodiment includes a ribbon insulating region itself, and no additional insulating material is used in Embodiment 3, the welding structure is more compact. In Embodiment 3, it is required that the position of the connecting ribbon should be placed accurately in the process of manufacturing the module, such that the holes in the ribbon insulating region 9c are just in one-to-one correspondence with the main grid electrodes, and the main grid electrode is in contact with the conductive region of the connecting ribbon.

Figure 12:
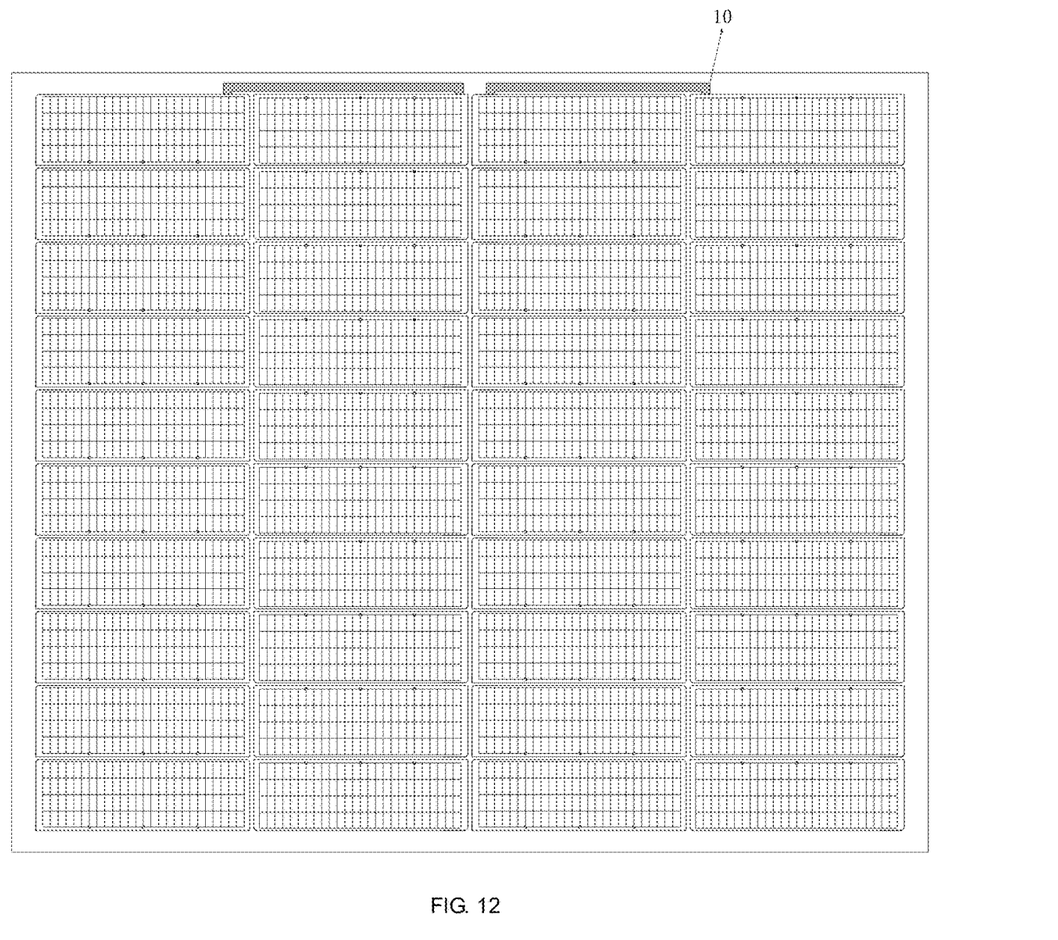
FIG. 12 is a front schematic diagram of a cell module according to the present invention.
Figure 13:
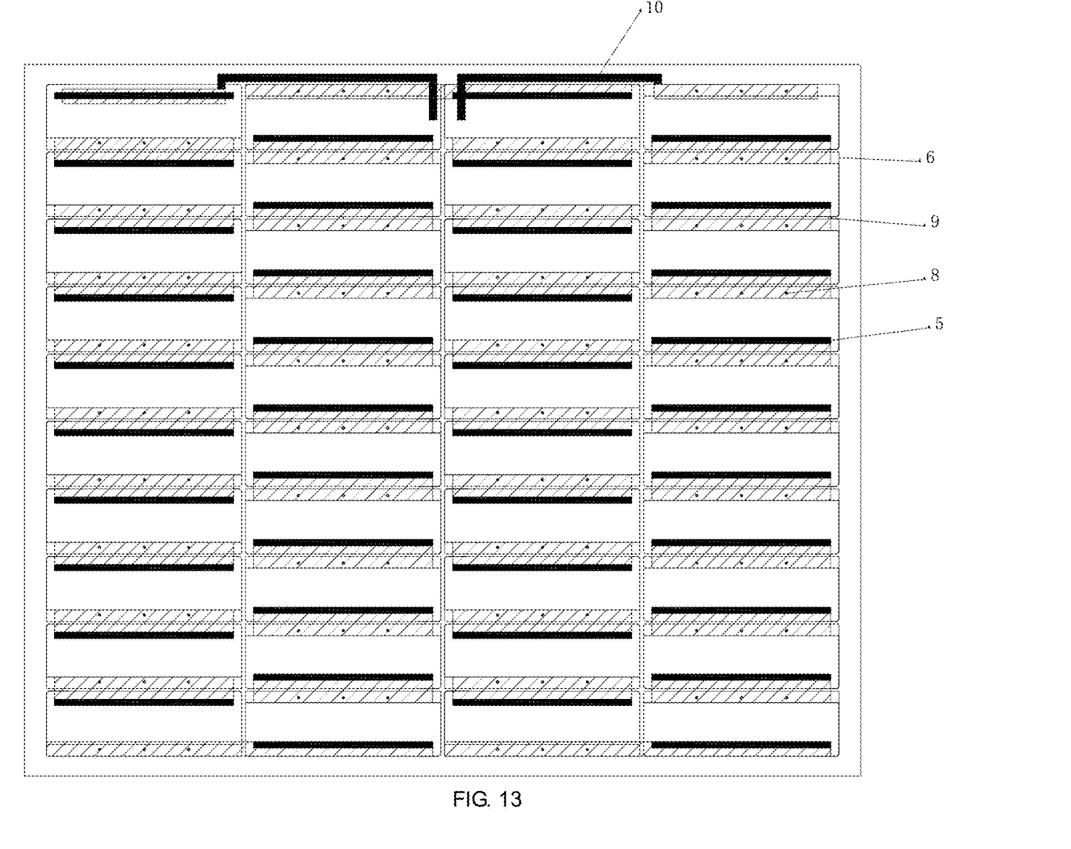
FIG. 13 is a back schematic diagram of a cell module according to the present invention.

FIG. 12 is a front schematic diagram of a cell module according to the present invention. FIG. 13 is a back schematic diagram of a cell module according to the present invention. When cells are connected to be a cell module and the plurality of cells are arranged in parallel. When a plurality of connecting ribbons 9 successively connect the plurality of cells together, a cell module is formed. Cells in single pieces are connected by welding in series or in parallel, in each column and between two adjacent cells, the main gate electrode 8 of one cell is adjacent to the back side electrode 5 of the other cell; the connecting ribbon 9 connects the main gate electrode 8 of one cell and the back side electrode 5 of the other adjacent cell together. That is to say, the welding direction of the ribbon is orthogonal to the length direction of the cell column. The gap between the newly-designed cells can be small, as long as there is no mutual extrusion, and light can be fully utilized.

Between two columns, cells on tips of the columns are connected in series through a connecting ribbon with a longer length. Finally, currents collected by cells are gathered to bus bars 10 to connect a junction box, and electric energy is output.

As for use of the cell module of the present invention, cells can be arranged and combined according to different requirements, and the number of cells can vary from 10 to 480 pieces. In the embodiments of FIG. 12 and FIG. 13, there are 40 pieces of cells altogether.

Figure 14:
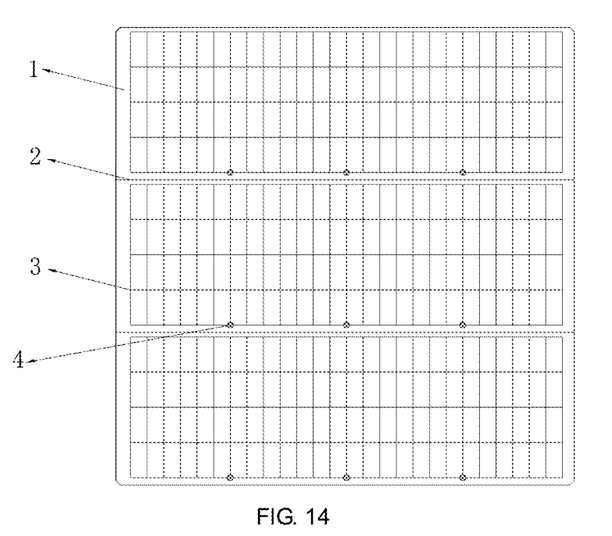
FIG. 14 is a front schematic diagram of cutting an original sheet into three cells.
Figure 15:
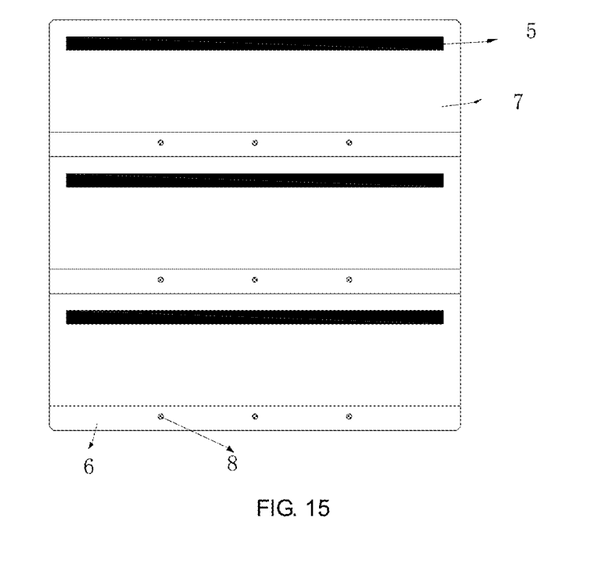
FIG. 15 is a back schematic diagram of cutting an original sheet into three cells.
Figure 16:
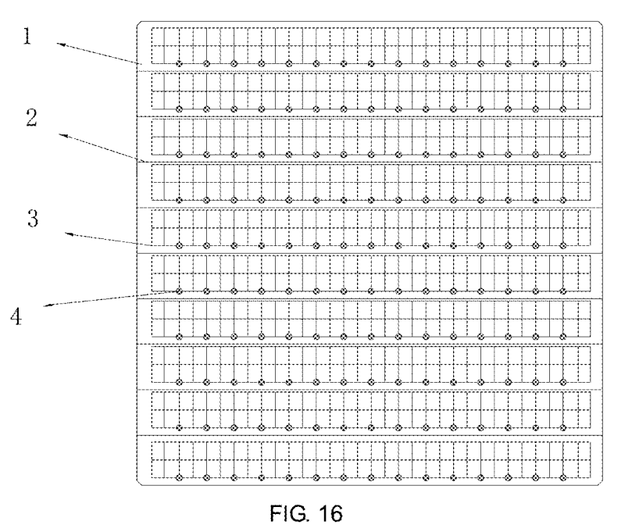
FIG. 16 is a front schematic diagram of cutting an original sheet into ten cells.
Figure 17:
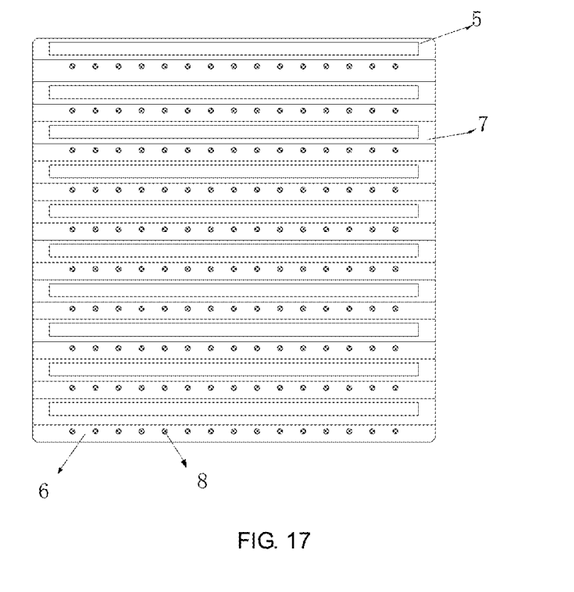
FIG. 17 is a back schematic diagram of cutting an original sheet into ten cells.

The method of manufacturing the cell module described above is as follows:

step 1, print and manufacture a cell on a monocrystalline silicon wafer with a conventional back contact process, wherein, after the cell has been manufactured, the back side of an original sheet comprises multiple pairs of back side electrodes and main gate electrodes which are parallel to each other. 3 to 10 pieces of cells can be printed simultaneously on a silicon wafer which is 156 mm long and 156 mm wide, and there can be 3 to 15 current collection holes on each cell. In this embodiment, a silicon wafer which is 156 mm long and 156 mm wide is selected to print the cells, however, the specific size of the silicon wafer is not limited in the present invention, and silicon wafers with other sizes can be selected as desired. FIG. 14 is a front schematic diagram of cutting an original sheet into three cells. FIG. 15 is a back schematic diagram of cutting an original sheet into three cells. After the silicon wafer is printed with a cell circuit, then original sheets printed with cells as shown in FIG. 14 and FIG. 15 are formed. In the embodiments as shown in FIG. 14 and FIG. 15, each cell has 3 current collection holes. FIG. 16 is a front schematic diagram of cutting an original sheet into ten cells. FIG. 17 is a back schematic diagram of cutting an original sheet into ten cells. In the embodiments as shown in FIG. 16 and FIG. 17, each cell has 15 current collection holes.

step 2, take a region where one pair of back side electrodes and main gate electrodes are located as a cell region; provide a cutting line 2 parallel to the back side electrode between two adjacent cell regions;

step 3, cut along the cutting line 2 to obtain a single piece of cell.

step 4, Arrange the plurality of cells in parallel in the same direction, between two adjacent cells, the main gate electrode of one cell is adjacent to the back side electrode of the other cell;

step 5, weld the main gate electrode of one cell and the back side electrode of the other adjacent cell together via the connecting ribbon. Finally, the cell module is obtained, and the cell module is with reference to FIG. 12 and FIG. 13.

Figure 18:
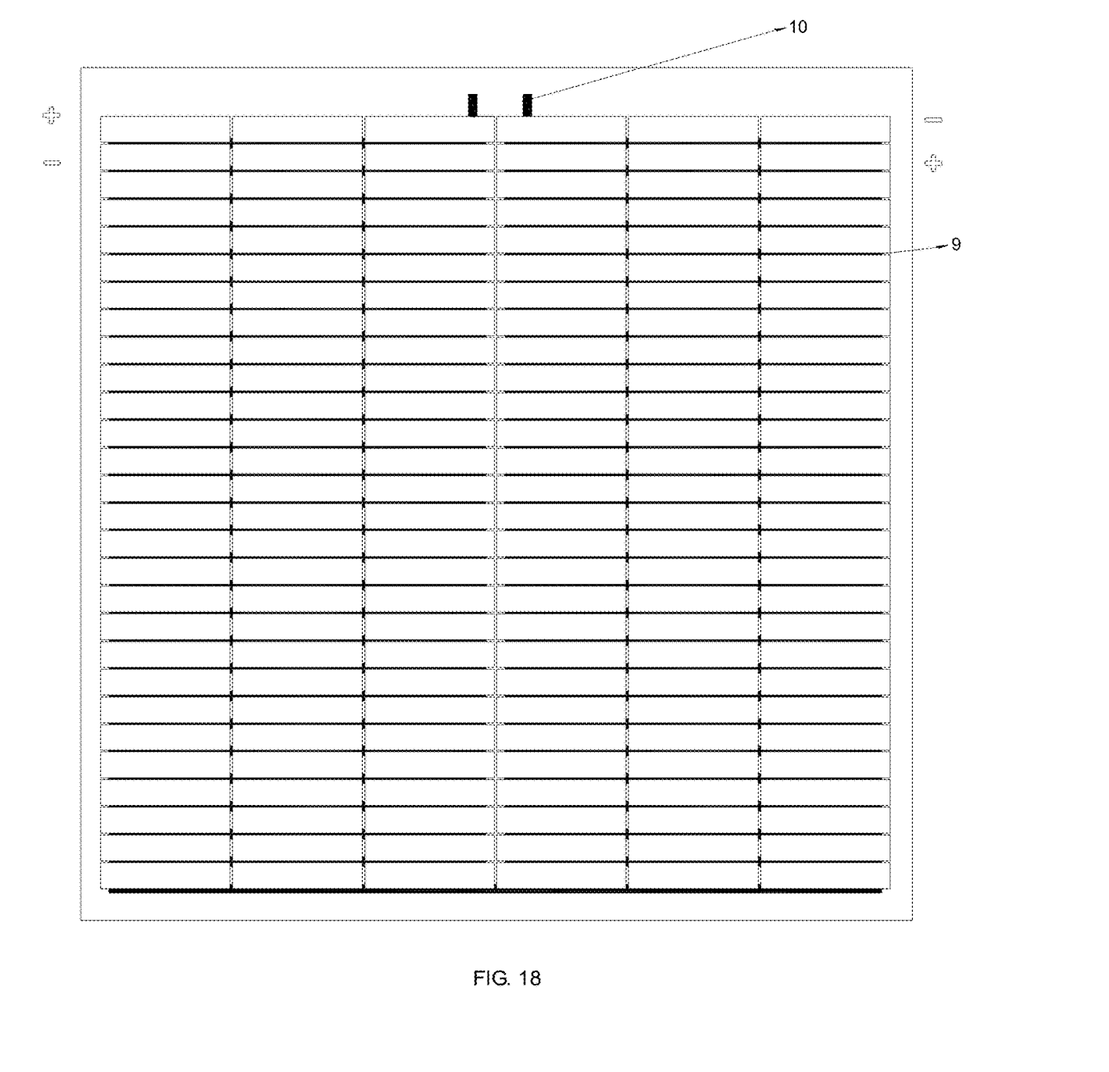
FIG. 18 is a front schematic diagram of a cell module with an XY interconnection structure.
Figure 19:
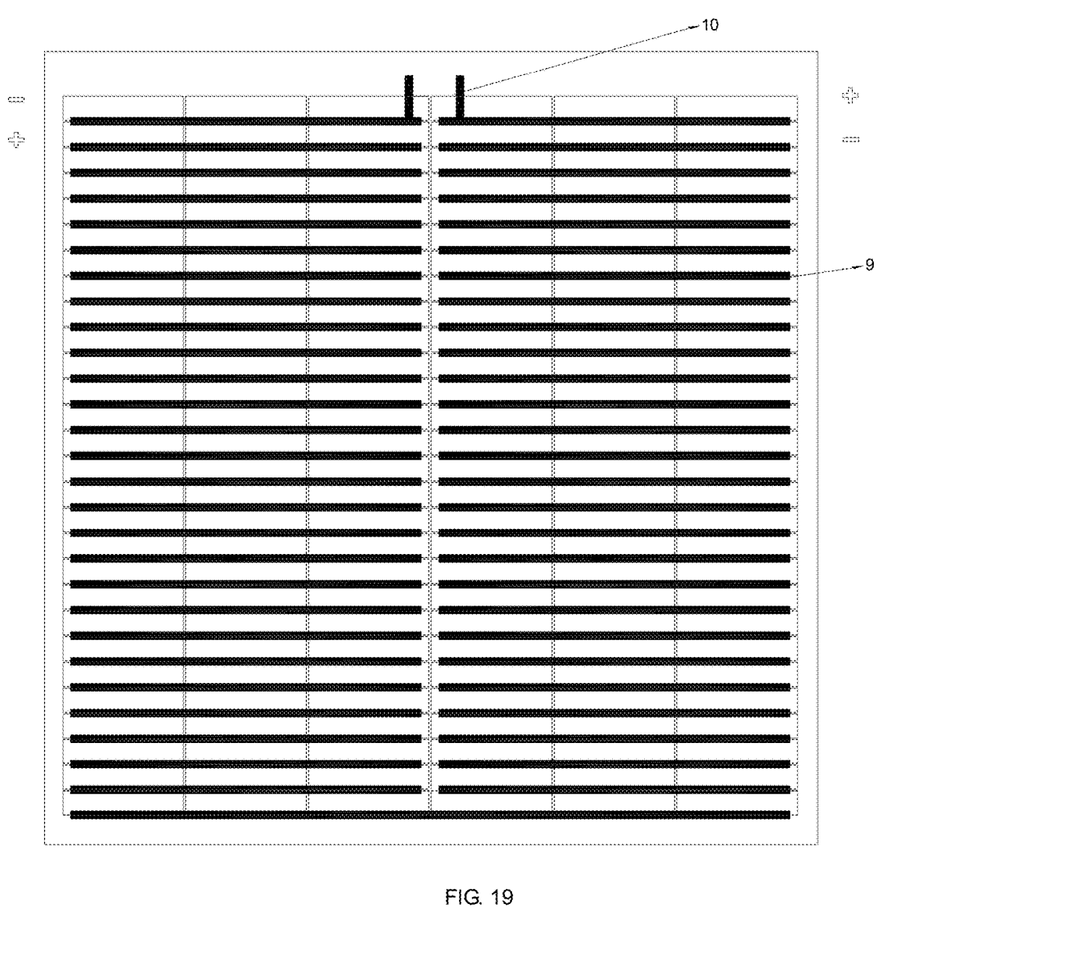
FIG. 19 is a back schematic diagram of a cell module with an XY interconnection structure.
Figure 20:
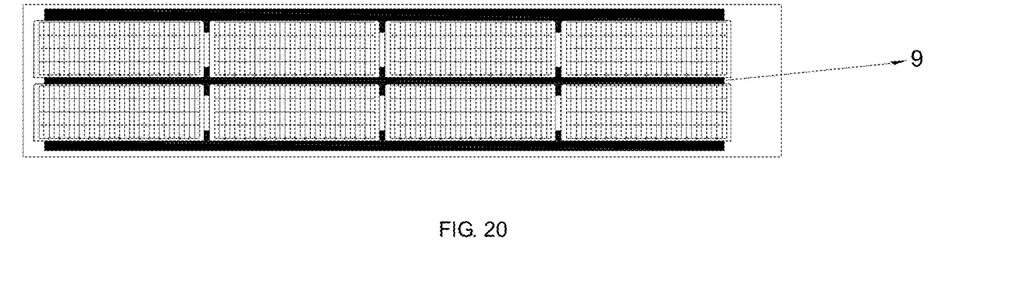
FIG. 20 is a front enlarged schematic diagram of a cell module with an XY interconnection structure.
Figure 21:
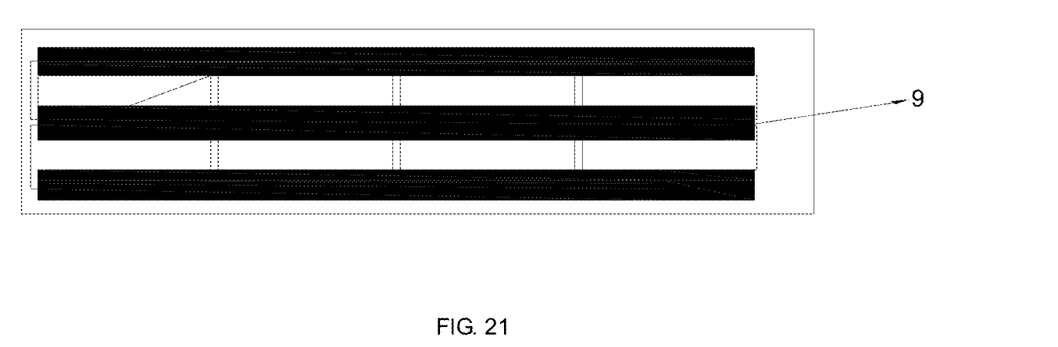
FIG. 21 is a back enlarged schematic diagram of a cell module with an XY interconnection structure.

As for the connecting ribbon and the cell module, the present invention also provides preferred technical solutions, that is, cells are connected to be a cell module with an XY interconnection structure via the connecting ribbon. FIG. 18 is a front schematic diagram of a cell module with an XY interconnection structure. FIG. 19 is a back schematic diagram of a cell module with an XY interconnection structure. FIG. 20 is a front enlarged schematic diagram of a cell module with an XY interconnection structure. FIG. 21 is a back enlarged schematic diagram of a cell module with an XY interconnection structure. As shown in FIG. 18 to FIG. 21, since cells are connected both transversely and longitudinally via the connecting ribbon in the cell module, it is referred to as an XY interconnection structure. A plurality of cell columns are arranged to be a cell module, between two adjacent sets of cell columns, positions of the cells are all in one-to-one correspondence with positions of the connecting ribbons; in each column, the main gate electrode of one cell is fixedly connected to the back side electrode of the other adjacent cell via the connecting ribbon, and between adjacent columns, connecting ribbons with corresponding positions are all interconnected.

In this technical solution, since a plurality of cell columns are also connected via connecting ribbons, when connecting ribbons in a single cell column are damaged, the current transmission path will not be broken, the current can be transmitted in the connecting ribbons of an adjacent column, and therefore, the service life of the cell module can be increased. Moreover, it can be seen from FIG. 19 that, the back side electrodes in this technical solution are arranged more orderly, and is suitable for an automated production process.

In view of the preferred technical solution, the method of manufacturing the cell module described above is as follows:

step 1, print and manufacture a cell on a monocrystalline silicon wafer with a conventional back contact process, wherein, after the cell has been manufactured, the back side of an original sheet comprises multiple pairs of back side electrodes and main gate electrodes which are parallel to each other;

step 2, take a region where one pair of back side electrodes and main gate electrodes are located as a cell region; provide a cutting line parallel to the back side electrode between two adjacent cell regions;

step 3, cut along the cutting line to obtain a single piece of cell.

step 4, arrange the plurality of cells in parallel in the same direction in columns, wherein, in each column, the main gate electrode of one cell is adjacent to the back side electrode of the other cell; arrange a plurality of cell columns to be a cell module, wherein, between two adjacent sets of cell columns, positions of the cells are all in one-to-one correspondence with positions of the connecting ribbons;

step 5, weld the main gate electrode of one cell in each cell column and the back side electrode of the other adjacent cell together via the connecting ribbon, and meanwhile, weld the plurality of cell columns in the cell module together via the connecting ribbon.

The method of manufacturing the cell module described above is as follows:

Those described above are only preferred embodiments of the present invention, and are not intended to limit the present invention. It should be understood that, other modifications and variations directly derived or associated by persons skilled in the art without departing from the spirit and concept of the present invention shall be deemed to fall within the protection scope of the present invention.

The invention claimed is:

1. A back-contact cell module, comprising a plurality of cells and a plurality of connecting ribbons; wherein,
  a plurality of auxiliary gate electrodes for collecting currents are provided on a front side of each cell; a plurality of current collection holes are provided on a substrate of the each cell; a plurality of main gate electrodes for gathering currents of the plurality of auxiliary gate electrodes and a back side electrode for leading out the currents are provided on a back side of the each cell; the plurality of auxiliary gate electrodes are connected to the plurality of main gate electrodes via the plurality of current collection holes; wherein, the back side electrode is linear; the main gate electrodes, located on the back side of the cell and in one-to-one correspondence with positions of the plurality of current collection holes, are arranged linearly, parallel to the back side electrode and located at two ends of the back side of the cell, respectively;
  the plurality of cells are arranged parallelly in columns, the plurality of main gate electrodes of one cell is arranged adjacent to the back side electrode of an other adjacent cell; the plurality of main gate electrodes of the one cell are fixedly connected to the back side electrode of the other adjacent cell via one of the plurality of connecting ribbons; and wherein a soldering direction of the plurality of connecting ribbons is orthogonal to a length direction of the columns of the plurality of cells.

2. The back-contact cell module according to claim 1, wherein, the plurality of current collection holes are arranged in one or more rows; when the plurality of current collection holes are arranged in more than one rows, two adjacent current collection holes are located at two different rows.

3. The back-contact cell module according to claim 1, wherein, multiple sets of auxiliary gate electrodes are arranged in parallel in a longitudinal direction, and in one-to-one correspondence with the plurality of current collection holes; multiple sets of anti-break electrodes are arranged perpendicularly and crosswise to the plurality of auxiliary gate electrodes.

4. The back-contact cell module according to claim 1, wherein, each connecting ribbon is made of an elastic material, and comprises a plurality of first slots in a lengthwise direction and a plurality of second slots in a transverse direction; the plurality of first slots are located at a middle portion of the each connecting ribbon; the plurality of second slots are located at two side edges of the each connecting ribbon, making a longitudinal edge of the each connecting ribbon to form a shape of notches; the plurality of second slots are arranged at equal intervals; the plurality of first slots are arranged in parallel with one another.

5. The back-contact cell module according to claim 1, wherein, a continuous linear insulating region is printed around the plurality of main gate electrodes and the connecting ribbon is made of a conductive material.

6. The back-contact cell module according to claim 1, wherein, an insulating region is printed around each main gate electrode; insulating regions around two adjacent main gate electrodes are discontinuous from each other; a layer of insulating materials is overlaid on the plurality of main gate electrodes; a hole is provided on the insulating material at a position corresponding to the position of the main gate electrode; the plurality of connecting ribbons are made of a conductive material.

7. The back-contact cell module according to claim 1, wherein, an insulating region is printed around each main gate electrode; insulating regions around two adjacent main gate electrodes are discontinuous from each other; each connecting ribbon is made of a conductive material; an insulating region is provided on the each connecting ribbon and at a side for connecting the plurality of main gate electrodes, the plurality of holes are provided on the insulating region at positions in one-to-one correspondence with the positions of the main gate electrodes; when the each connecting ribbon and the cell are stacked and soldered, the main gate electrode passes through the insulating region of the each connecting ribbon and is in contact with the conductive material.

8. The back-contact cell module according to claim 5, wherein, a plurality of cell columns are arranged to be a cell module, between two adjacent sets of cell columns, positions of the cells are all in one-to-one correspondence with positions of the plurality of connecting ribbons; in each column, the plurality of main gate electrodes of one cell are fixedly connected to the back side electrode of the other adjacent cell via one of the plurality of connecting ribbons, and between adjacent columns, the plurality of connecting ribbons with corresponding positions are all interconnected.

9. The back-contact cell module according to claim 6, wherein, a plurality of cell columns are arranged to be a cell module, between two adjacent sets of cell columns, positions of the cells are all in one-to-one correspondence with positions of the plurality of connecting ribbons; in each column, the plurality of main gate electrodes of one cell are fixedly connected to the back side electrode of the other adjacent cell via one of the connecting ribbons, and between adjacent columns, the plurality of connecting ribbons with corresponding positions are all interconnected.

10. The back-contact cell module according to claim 7, wherein, a plurality of cell columns are arranged to be a cell module, between two adjacent sets of cell columns, positions of the cells are all in one-to-one correspondence with positions of the plurality of connecting ribbons; in each column, the plurality of main gate electrodes of one cell are fixedly connected to the back side electrode of the other adjacent cell via one of the plurality of connecting ribbons, and between adjacent columns, the plurality of connecting ribbons with corresponding positions are all interconnected.

* * * * *